(12) United States Patent
Huang et al.

(10) Patent No.: US 8,305,121 B1
(45) Date of Patent: Nov. 6, 2012

(54) HIGH-PERFORMANCE MEMORY INTERFACE CIRCUIT ARCHITECTURE

(75) Inventors: Joseph Huang, San Jose, CA (US); Chiakang Sung, Milpitas, CA (US); Philip Pan, Fremont, CA (US); Yan Chong, San Jose, CA (US); Andy L. Lee, San Jose, CA (US); Brian D. Johnson, Issaquah, WA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 13/168,499

(22) Filed: Jun. 24, 2011

Related U.S. Application Data

(63) Continuation of application No. 12/467,681, filed on May 18, 2009, now Pat. No. 7,969,215, which is a continuation of application No. 11/789,598, filed on Apr. 24, 2007, now Pat. No. 7,535,275, which is a continuation of application No. 11/055,125, filed on Feb. 9, 2005, now Pat. No. 7,227,395.

(51) Int. Cl.
*H03L 7/00* (2006.01)

(52) U.S. Cl. .................... 327/161; 327/158; 327/159

(58) Field of Classification Search .......... 327/147–150, 327/156–161
See application file for complete search history.

(56) References Cited

U.S. PATENT DOCUMENTS 6,838,917 B2 * 1/2005 Brass et al. ................. 327/158
7,394,301 B2 * 7/2008 Fetzer et al. ................ 327/262

* cited by examiner

*Primary Examiner* — An Luu
(74) *Attorney, Agent, or Firm* — Ward & Zinna, LLC

(57) ABSTRACT

A programmable memory interface circuit includes a programmable DLL delay chain, a phase offset control circuit and a programmable DQS delay chain. The DLL delay chain uses a set of serially connected delay cells, a programmable switch, a phase detector and a digital counter to generate a coarse phase shift control setting. The coarse phase shift control setting is then used to pre-compute a static residual phase shift control setting or generate a dynamic residual phase shift control setting, one of which is chosen by the phase offset control circuit to be added to or subtracted from the coarse phase shift control setting to generate a fine phase shift control setting. The coarse and fine phase shift control settings work in concert to generate a phase-delayed DQS signal that is center-aligned to its associated DQ signals.

15 Claims, 6 Drawing Sheets

HIGH-PERFORMANCE MEMORY INTERFACE CIRCUIT ARCHITECTURE

This application is a continuation of application Ser. No. 12/467,681, filed May 18, 2009, now U.S. Pat. No. 7,969,215 B1, which application is a continuation of application Ser. No. 11/789,598, filed Apr. 24, 2007, now U.S. Pat. No. 7,535,275 B1, which application is a continuation of application Ser. No. 11/055,125, filed Feb. 9, 2005, now U.S. Pat. No. 7,227,395 B1, all of which applications are incorporated herein by reference.

The present invention relates generally to data transmission schemes between various digital devices and more particularly to a high-performance memory interface circuit architecture.

CROSS-REFERENCE TO RELATED APPLICATIONS

"Calibration of memory interface circuitry," filed Jun. 21, 2004 and fully incorporated by reference herein; and "Soft core control of dedicated memory interface hardware in a programmable logic device", filed Jun. 21, 2004 and fully incorporated by reference herein.

BACKGROUND OF THE INVENTION

A memory device in an electronic system is used for storing various types of data. The data often need to be transmitted to a data processing device in the system, e.g., a central processing unit (CPU) or a programmable logic device (PLD), through a set of communication channels and processed therein to produce certain results. A set of communication channels typically includes one or more channels carrying data signals (DQ) and one channel carrying a data strobe signal (DQS), whose rising/falling edges are used by a device, e.g., a memory controller, that interfaces the memory device with the data processing device to sample the DQ signals.

A DQS signal coming out of a memory device is usually configured to be edge-aligned with its associated DQ signals so that there is no phase shift between the two types of signals when they reach the memory controller. In practice, to sample the DQ signals accurately, it is preferred that there be a phase delay, e.g., 90° or 72°, between the DQ signals and the DQS signal so that a data sampling edge of the DQS signal is positioned within a data sampling window associated with the DQ signals. Preferably, the DQS signal is at the center of the data sampling window.

The size of a data sampling window depends upon which data sampling scheme is chosen for a memory device. FIGS. 1A and 1B schematically illustrate two typical data sampling schemes that are often used by a memory controller: (1) the single-data-rate (SDR) scheme in FIG. 1A in which a DQ signal 160 is sampled once per cycle of DQS signal 120; and (2) the double-data-rate (DDR) scheme in FIG. 1B in which a DQ signal 170 is sampled twice per cycle of DQS signal 130, once on the rising edge of the DQS signal and once on the falling edge. In both schemes, the DQS signals (120, 130) are initially edge-aligned with their respective DQ signals (160, 170). But a single data bit of the DQ signal 160 is twice as long as a single data bit of the DQ signal 170.

In the SDR scenario, only the rising edges of a 180°-delayed DQS signal 140 are used for sampling the DQ signal 160. By contrast, both the rising and falling edges of a 90°-delayed DQS signal 150 are used for sampling the DQ signal 170 in the DDR scenario. As a result, the data sampling window $W_{90}$ in FIG. 1B is only about half the data sampling window $W_{180}$ in FIG. 1A. Clearly, a small data sampling window increases the possibility of data sampling errors and therefore compromises efforts toward improving a memory device's performance by increasing its operating frequency.

Meanwhile, there are many factors, e.g., process, voltage and temperature (PVT), etc., that can change the phase shift between a DQ signal and a DQS signal. Even if a DQS signal is initially center-aligned with a DQ signal, it may subsequently "drift" away from the center of the data sampling window if the environment varies.

In view of the above discussion, it is desirable to develop a memory interface circuit architecture that adaptively determines a desired phase delay to center-align a DQS signal to a DQ signal and dynamically adjusts the phase-shifted DQS signal when its sampling edge deviates from the center of the DQ signal's data sampling window.

SUMMARY OF THE INVENTION

A programmable memory interface circuit includes a programmable DLL delay chain, a phase offset control circuit and a programmable DQS delay chain. The DLL delay chain uses a set of serially connected delay cells, a programmable switch, a phase detector and a digital counter to generate a coarse phase shift control setting. In addition, the coarse phase shift control setting is used for generating a fine phase shift control setting, that is also applied to the DQS delay chain. The coarse and fine phase shift control settings work in concert to generate a phase-delayed DQS signal that preferably is center-aligned to its associated DQ signals.

BRIEF DESCRIPTION OF THE DRAWINGS

The aforementioned features and advantages of the invention as well as additional features and advantages thereof will be more clearly understood hereinafter as a result of a detailed description of preferred embodiments of the invention when taken in conjunction with the drawings.

Like reference numerals refer to corresponding parts throughout the several views of the drawings.

DETAILED DESCRIPTION OF THE EMBODIMENTS

Figure 1A:
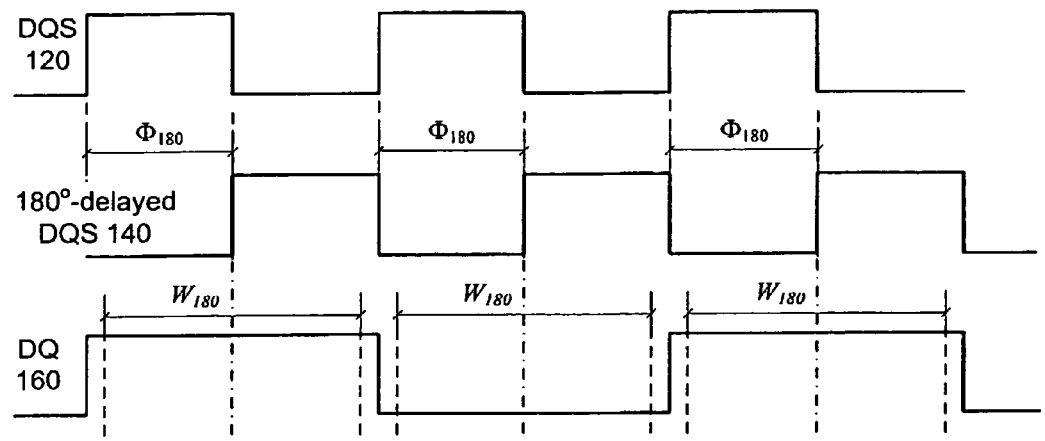
FIGS. 1A and 1B schematically illustrate two typical data sampling schemes that are often used by a memory controller.
Figure 1B:
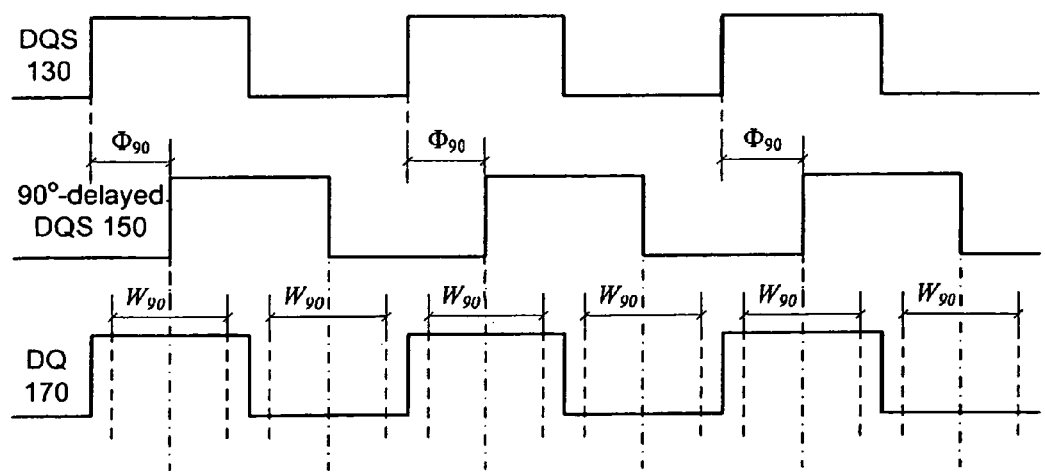
Figure 2:
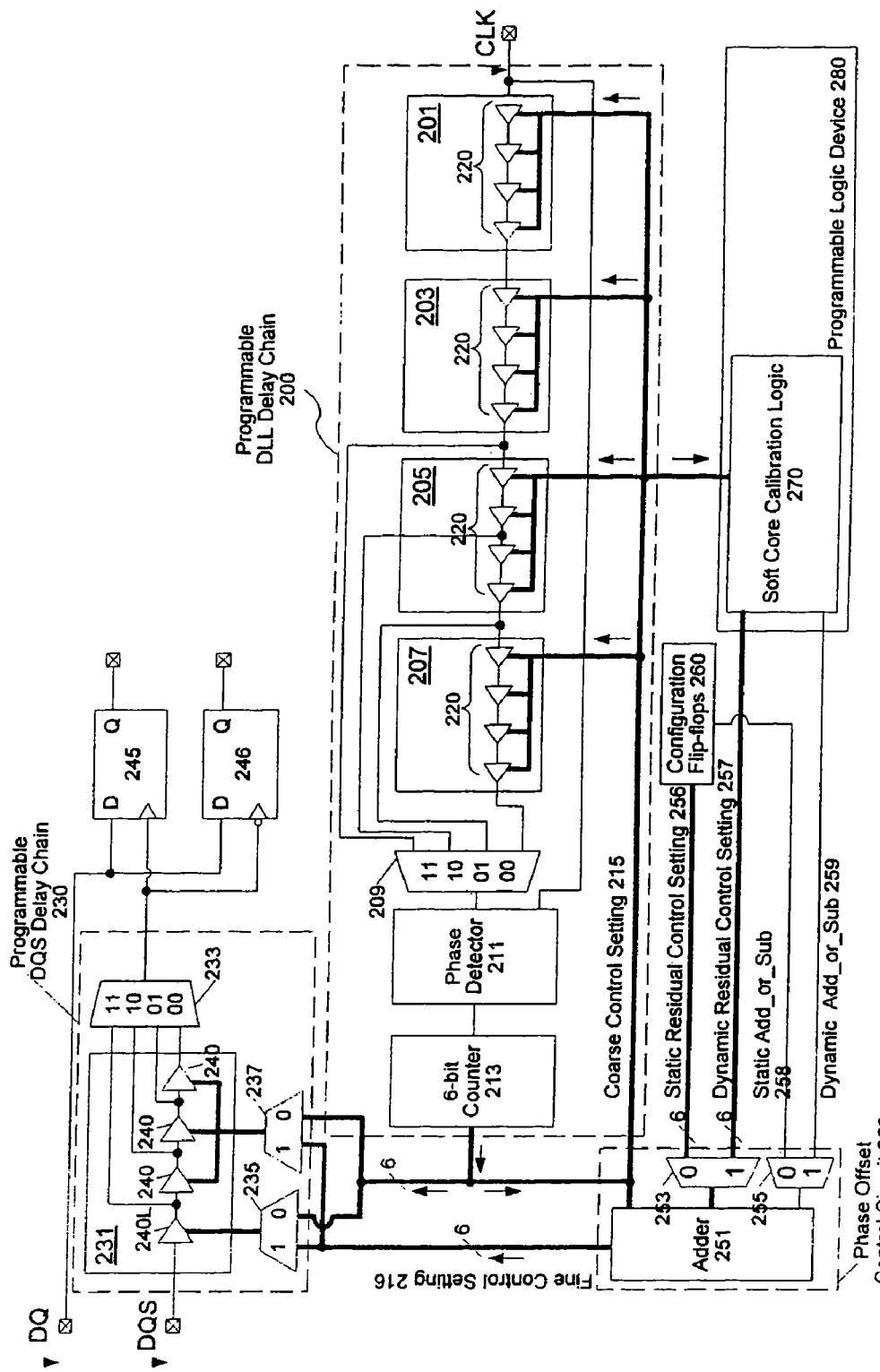
FIG. 2 is a diagram illustrative of a programmable memory interface circuit architecture according to one embodiment of the present invention.

FIG. 2 is a diagram illustrative of a programmable memory interface circuit architecture according to one embodiment of the present invention. The interface circuit primarily includes three functionally distinct components, i.e., a programmable delay locked loop (DLL) delay chain 200, a phase offset control circuit 250 and a programmable DQS delay chain 230. A pair of DQ and DQS signals coming from a memory device (not shown) enters the interface circuit at respective DQ and DQS terminals at the top-left corner of FIG. 2. The DQS signal passes through the programmable DQS delay chain 230 and incurs a desired amount of phase delay. The phase-delayed DQS signal is then used to sample the DQ signal at the two latches 245 and 246 with its two opposite edges.

As discussed above, the phase delay applied to the DQS signal needs to be precise in order to shift the DQS signal's sampling edge exactly to the center of a data sampling window. The phase delay also needs to be dynamically updated if the sampling edge significantly drifts away from the center of the window due to environmental impacts. The programmable DLL delay chain 200 and the phase offset control circuit 250 are configured to generate a phase shift control setting which, when applied to the programmable DQS delay chain 230, produces the desired phase delay to the DQS signal.

The programmable DLL delay chain 200 includes 16 serially connected delay cells 220 that are organized into four sub-chains 201, 203, 205, 207, each sub-chain having four delay cells 220. A clock signal CLK is applied to the programmable DLL delay chain 200 at a clock terminal. Each of the 16 delay cells receives the same coarse phase shift control setting 215 and in response thereto causes the same amount of phase delay to the clock signal that passes through the delay cell. The amount of phase delay per cell has two components: a variable component that is determined by phase shift control setting 215 and an intrinsic setting that is determined by the time it takes a signal to traverse the delay cell when the variable component is zero. The output of the 16th delay cell in the series is connected to one input terminal "00" of a programmable switch 209. Similarly, the outputs of the 12th, 10th and 8th delay cells in the series are respectively connected to input terminals "01", "10" and "11" of the programmable switch 209. As a result, there are four versions of the clock signal with different phase delays at the four inputs of the programmable switch 209.

The programmable switch 209 is configured to allow one of the phase-delayed clock signals to reach one input terminal of a phase detector 211. Another input terminal of the phase detector 211 is directly connected to the clock terminal. Thus, the phase detector 211 receives two copies of the clock signal, one with virtually no phase delay and the other with a phase delay. The phase detector 211 compares the two copies to determine whether the phase difference between the two copies is exactly 360° (or a clock cycle). If not, the phase detector 211 sends an update instruction to a 6-bit counter 213 which is responsible for updating the coarse phase shift control setting 215. Accordingly, the 6-bit counter 213 increases or decreases the coarse phase shift control setting 215 by a certain number and the updated coarse phase shift control setting 215 is fed back to adjust the amount of phase delay generated by each delay cell until the two copies of the clock signal overlap one another. In some embodiments, it takes multiple clock cycles for the programmable DLL delay chain 200 to determine an optimal coarse phase shift control setting 215.

For example, if all 16 delay cells 220 are involved in the determination of the optimal coarse phase shift control setting, the phase delay generated by each delay cell will be approximately 360°/16=22.5°. If only 12 delay cells are used, there will be a 30° delay per cell, for 10 delay cells there will be 36° delay per cell; and for 8 delay cells there will be a 45° delay per cell.

The optimal coarse phase shift control setting 215 is subsequently applied to a set of delay cells 240 in the programmable DQS delay chain 230. In one embodiment, since the delay cells in the two delay chains are functionally identical, a delay cell 240 in the DQS delay chain 230 controlled by the coarse phase shift control setting 215 generates the same phase shift as does a delay cell 220 in the DLL delay chain 200. Therefore, if the desired phase delay is 90° and the coarse phase shift control setting corresponds to 30° phase delay, a configuration including three delay cells 240 in the DQS delay chain 230 will produce a desired 90°-delayed DQS signal. However, since delay cells 220 can only produce discrete delay values like 22.5°, 30°, 36° or 45°, there are severe limits on the possible delay that can be generated by the programmable DQS delay chain 230 using only the coarse phase shift control setting 215.

Due to various technical reasons, such as routing path differences and/or rise/fall edge mismatches between the DQ and DQS signals, a desired phase delay may not be a multiple of the phase delay generated by an individual delay cell 240 controlled by coarse phase shift control setting 215. After applying the optimal coarse phase shift control setting 215 to the programmable DQS delay chain 230, there may still be a residual phase difference between the sampling edge of the DQS signal and the center of the data sampling window of the DQ signal. Thus, there is a need for another phase shift control setting that finely tunes the DQS signal to eliminate or at least reduce the residual phase difference.

In some embodiments, given certain information about the electronic system, e.g., the data sampling scheme, the operating frequency, and the specific configuration of the two delay chains, etc., it is possible during system design to pre-compute a phase shift control setting corresponding to the residual phase difference. This pre-computed control setting which may be referred to as the static residual phase shift control setting 256 is stored in the configuration flip-flops 260 of FIG. 2. This residual setting may then be added to or subtracted from the coarse phase shift control setting through switch 253 and adder 251 to generate a fine phase shift control setting 216.

However, as mentioned above, an initially center-aligned DQS signal may drift away from the center of a data sampling window due to environmental impacts. For example, due to PVT variations, the configuration flip-flops 260 may provide a different static residual phase shift control setting 256 from time to time or the intrinsic delay in the delay cells may change. Therefore, a dynamically-generated residual phase shift control setting is needed.

Accordingly, in a preferred embodiment of the invention shown in FIG. 2, a soft core calibration logic 270 in a programmable logic device 280 generates a dynamic residual phase shift control setting 257 in response to the coarse phase shift control setting 215. This calibration logic 270, periodically or on request, checks if the current DQS signal's sampling edge has missed the center of the data sampling window by comparing a data sampling result with a data sampling pattern stored in the memory device. If the sampling edge has missed the center due to, e.g., PVT variations, the calibration logic 270 updates the dynamic residual phase shift control setting 257 to move the sampling edge back to the center of the data sampling window. A more detailed discussion of the soft core calibration logic is found in the above-referenced pending applications "Calibration of memory interface circuitry" and "Soft core control of dedicated memory interface hardware in a programmable logic device".

As shown in FIG. 2, the static residual phase shift control setting 256 is registered into a storage device, e.g., a set of configuration flip-flops 260, and the dynamic residual phase shift control setting 257 is stored in the soft core calibration logic 270, each setting comprising 6 digital bits. The configuration flip-flops 260 and the soft core calibration logic 270 are, respectively, connected to the two input terminals of a programmable switch 253 in the phase offset control circuit 250. Additionally, each residual setting has an associated instruction bit indicating whether the phase offset associated with the setting should be added to or subtracted from the phase delay generated by the coarse phase shift control setting 215. The two instruction bits are two inputs into another programmable switch 255 in the phase offset control circuit 250 that chooses an instruction bit corresponding to the setting chosen at the switch 253. The outputs of the two switches 253 and 255 and the coarse phase shift control setting 215 are inputs to adder 251. The operation of the adder 251 is similar to that of 6-bit counter 213. Based upon the instruction bit at the switch 255, the adder 251 determines whether to increase or decrease the coarse phase shift control setting 215 by the value present at the output of switch 253 to generate the fine phase shift control setting 216 that is subsequently transmitted to the DQS delay chain 230 to finely tune the phase delay of the DQS signal.

As noted above, the static residual phase shift control setting 256 may be affected by PVT variations. To recover from the PVT variations, the system usually needs to be powered down first in order to re-program the configuration flip-flops 260. In contrast, if the fine phase shift control setting 216 is a function of the dynamic residual phase shift control setting 257 and its associated instruction bit generated by the soft core calibration logic 270, the system does not have to be shut down to update the fine shift control setting 216.

The programmable DQS delay chain 230 includes two programmable switches, switch 235 interfacing the coarse and fine phase shift control settings with the leftmost delay cell 240L and switch 237 interfacing the coarse and fine phase shift control settings with the other three cells 240. In one embodiment, switch 235 is programmed so that the leftmost cell 240L is controlled by the fine phase shift control setting and switch 237 is programmed so that the other three delay cells are controlled by the coarse phase shift control setting. As a result, the three delay cells generate one portion of the desired phase delay and the leftmost delay cell contributes another portion that includes the residual phase difference.

It will be understood by one skilled in the art that the configurations of the two delay chains 200, 230 shown in FIG. 2 are only for illustrative purposes. For example, in other embodiments, each delay chain may include a programmable switch that has one input terminal for every unique number of delay cells in the series. Different configurations of the programmable DLL and DQS delay chains generate a wide variety of discrete phase delays. Given that the number of active delay cells in the DLL delay chain is M and the number of active delay cells controlled by the coarse phase shift control setting in the DQS delay chain is N, a coarse phase shift associated with the coarse phase shift control setting can be defined as:

$$V = 360° \cdot \frac{N}{M}$$

Therefore, the programmable DLL and DQS delay chains provide a system designer more flexibility in designing a memory interface circuit.

Figure 3A:
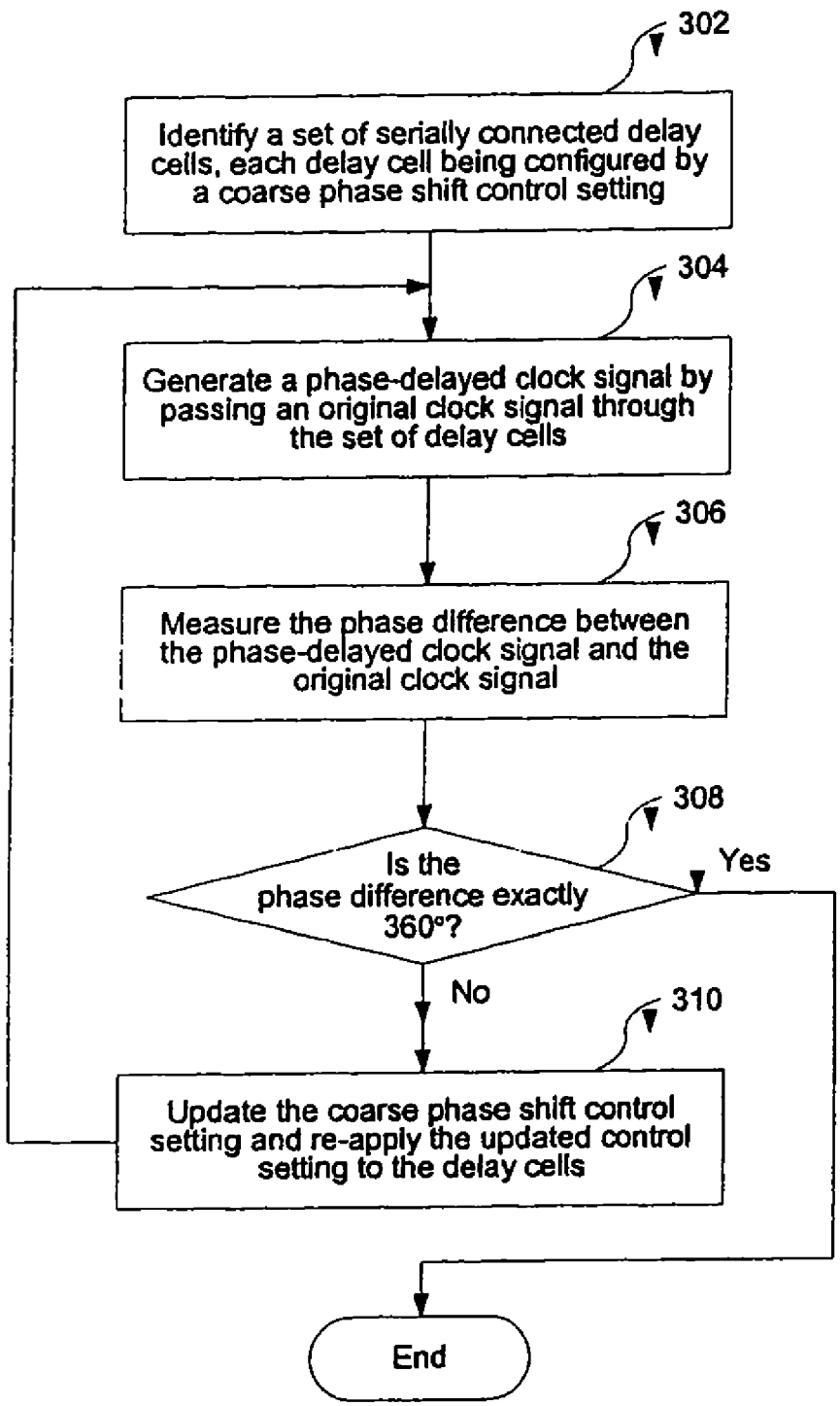
FIGS. 3A-3C are three flowcharts summarizing the operations of different components in the programmable memory interface circuit according to one embodiment of the present invention.
Figure 3B:
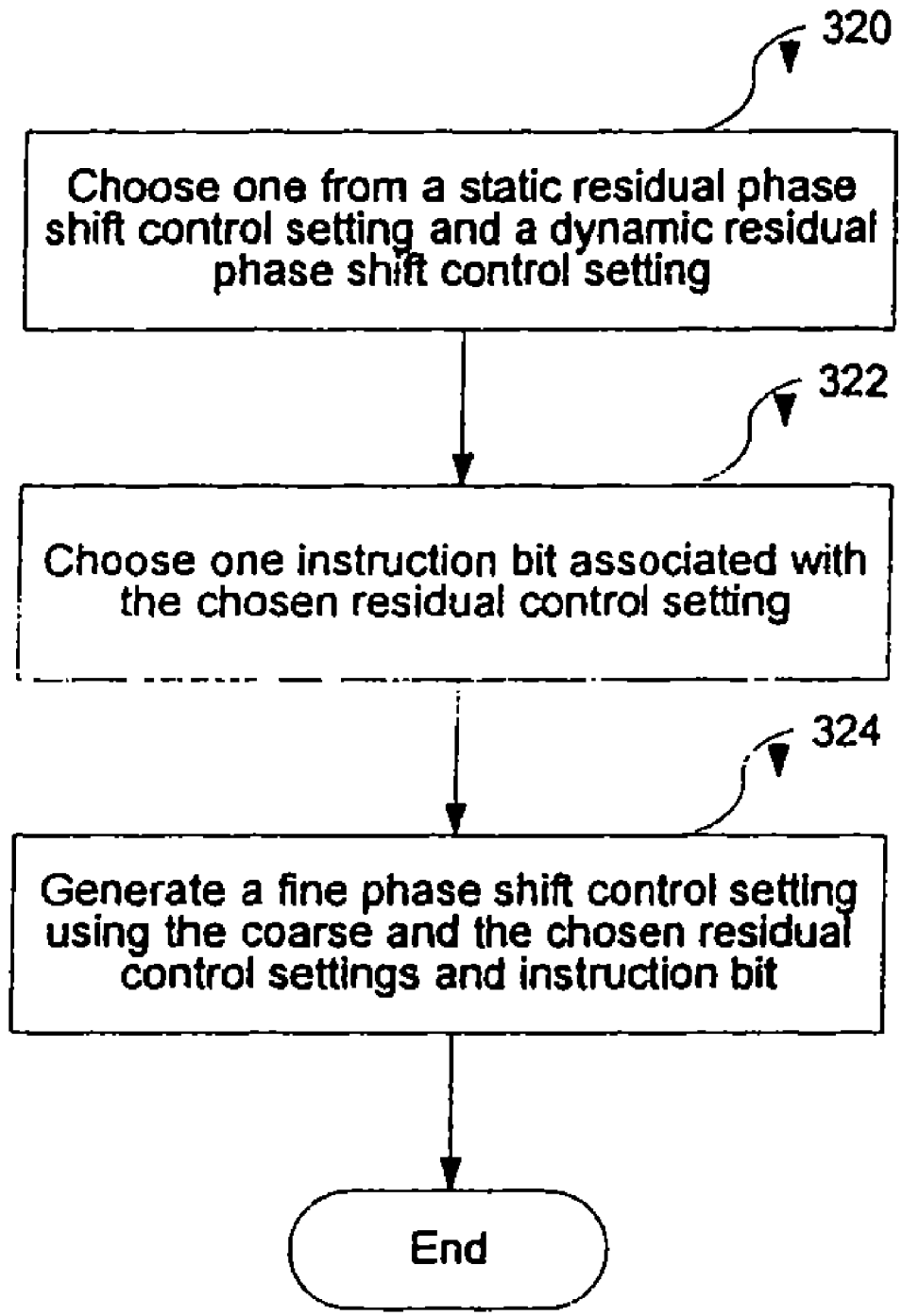
Figure 3C:
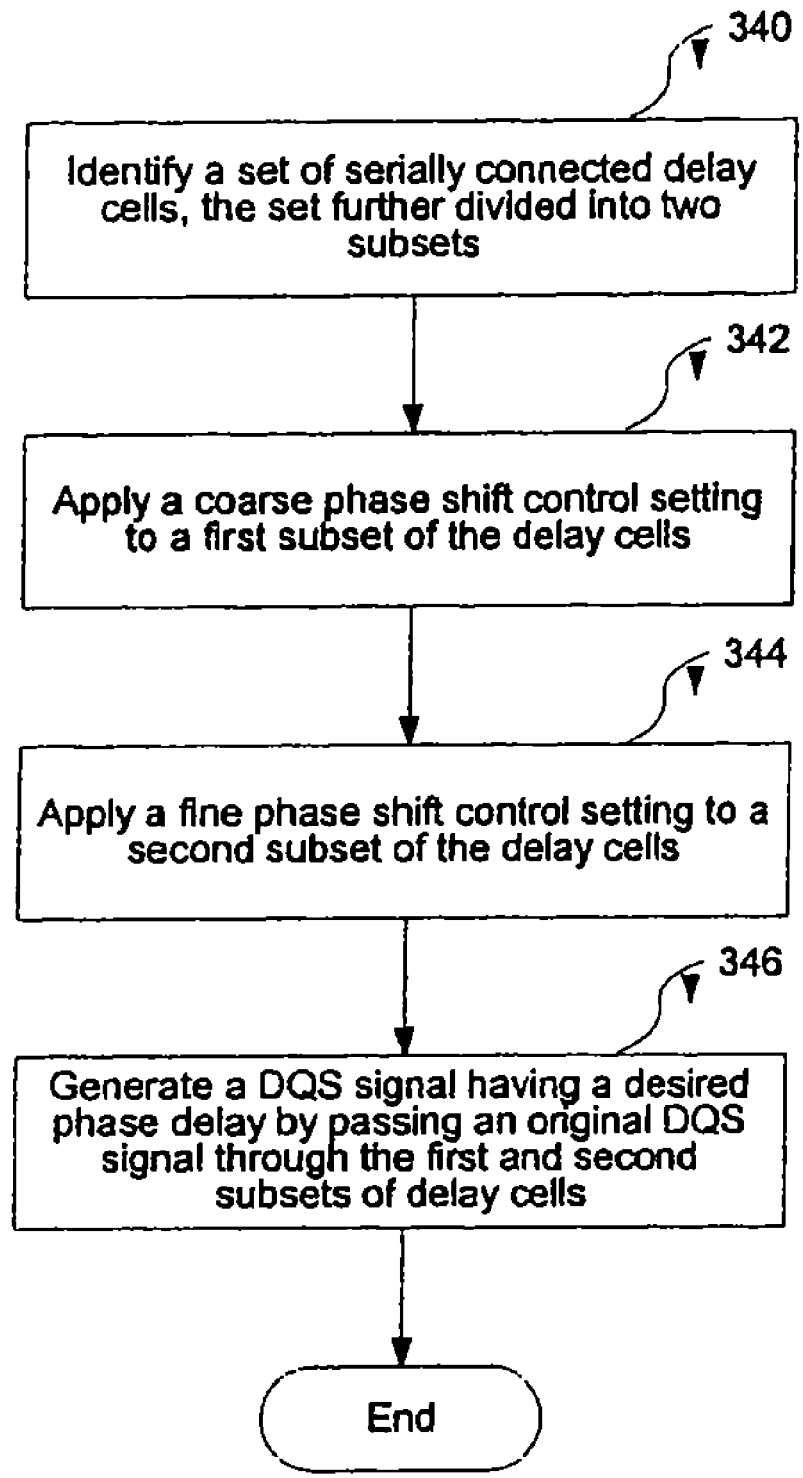
Figure 4:
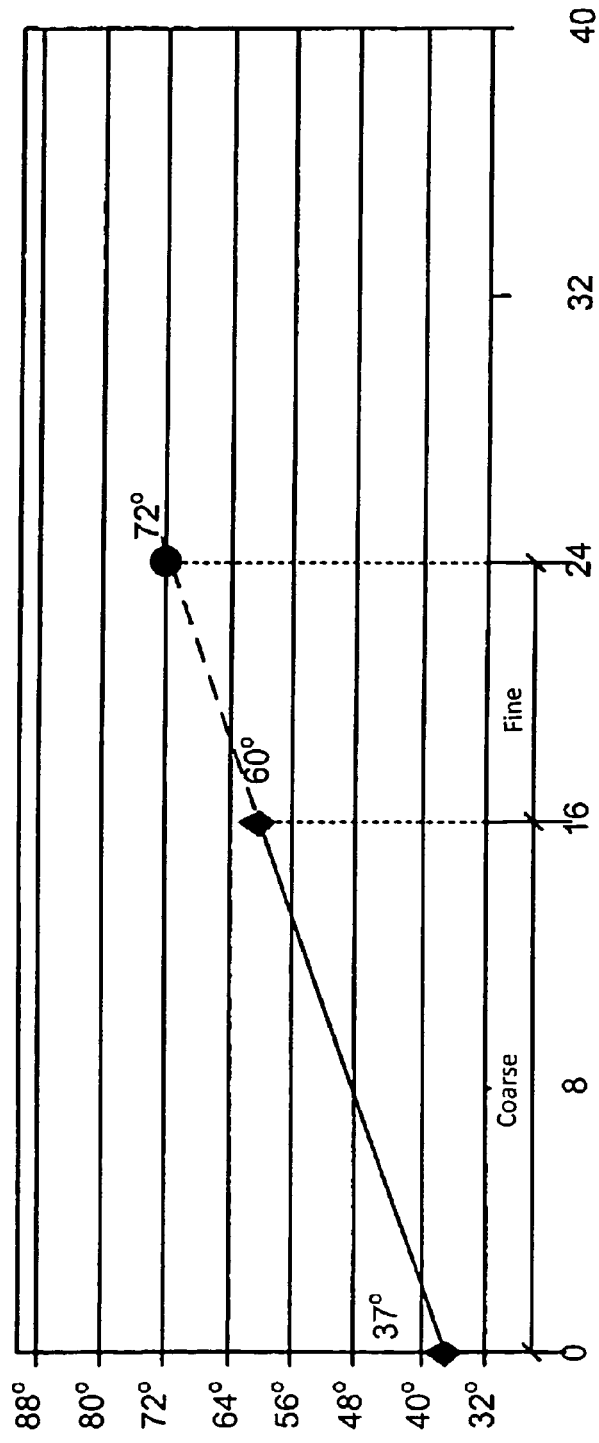
FIG. 4 is a chart illustrating how the different components in the memory interface circuit coordinate to generate a desired phase delay.

FIGS. 3A-3C are three flowcharts summarizing the operations of different components in the programmable memory interface circuit shown in FIG. 2. At step 302 of FIG. 3A, the switch 209 in the DLL delay chain 200 is first programmed to select a set of serially connected delay cells 220, each delay cell being associated with a coarse phase shift control setting.

At step 304, a clock signal is applied to the set of delay cells to generate at the input to switch 209 a clock signal having a phase delay specified by the coarse control setting. At step 306, the phase detector measures the phase delay caused by the set of delay cells. If the phase delay is not exactly 360° (step 308), the digital counter is prompted by the phase detector to update the coarse phase shift control setting at step 310. This process continues until the phase delay is exactly 360°.

At step 320 of FIG. 3B the phase offset control circuit 250 chooses one of the static and dynamic residual control settings. The static residual control setting is pre-computed and stored in a storage device, while the dynamic residual control setting is dynamically generated by the soft core calibration logic 270. Both the static and dynamic residual control settings are determined in accordance with the coarse phase shift control setting 215 and a desired phase shift of the DQS delay chain 230. More specifically, a phase delay determined by the static or dynamic residual control setting corresponds to a residual phase difference that cannot be provided by the coarse phase shift control setting. At step 322, the phase offset control circuit 250 chooses an instruction bit associated with one of the two residual control settings chosen previously. Finally, at step 324, the phase offset control circuit generates a new fine phase shift control setting by summing the coarse control setting and a positive or negative value of one of the static and dynamic residual control settings and then applying the new fine phase shift control setting to the DQS delay chain 230 to finely tune the phase shift of the DQS signal.

At step 340 of FIG. 3C the DQS delay chain 230 first selects a set of serially connected delay cells 240. The set of delay cells is divided into two subsets. At steps 342 and 344, the two subsets of delay cells are respectively configured by the coarse and fine phase shift control settings. At step 346 a DQS signal is fed into the DQS delay chain 230 comprising the two subsets of delay cells to produce a desired phase delay that shifts the DQS signal's sampling edge to the center of a corresponding DQ signal's data sampling window. If the fine phase shift control setting used at step 344 is derived from the dynamic control setting, the memory interface circuit can adjust the DQS signal to stay center-aligned with the DQ signal.

The following example illustrates how the different components in the memory interface circuit shown in FIG. 2 work in concert to generate a desired phase delay. Assume that 12 delay cells 220 are selected in the DLL delay chain. Accordingly, the phase delay generated by each delay cell 220 is 360°/12=30°. Also assume that two delay cells are selected in the DQS delay chain 230. In particular, the two delay cells include the leftmost delay cell 240L configured by the fine phase shift control setting and a delay cell 240 next to it configured by the coarse phase shift control setting. Further assume that the intrinsic phase delay from the input to the output of the DQS delay chain 230 is 37° when both settings are 000000 (or 0 in decimal). Thus, the intrinsic phase delay for each delay cell is 18.5°. If the desired phase delay is 72°, the leftmost delay cell configured by the fine phase shift control setting will be responsible for generating a 42° phase delay since the delay cell next to it that is configured by the coarse phase shift control setting has a fixed 30° phase delay.

In order for the leftmost delay cell to generate exactly a 42° phase delay, the fine phase shift control setting 216 applied to the leftmost delay cell 240L needs to be higher than the coarse phase shift control setting 215 applied to the delay cell 240 next to it. The exact difference between the two control settings depends on an important parameter of the delay cells, i.e., their phase offset resolution. The term "phase offset resolution" refers to the variation of phase delay associated with a delay cell 220 or 240 when its phase shift control setting changes by one unit. For example, if we assume that the coarse control setting 215 generated by the DLL delay chain 200 that produces a 30° phase shift is 010000 (or 16 in decimal), the phase offset resolution of each delay cell is approximately equal to (30°−18.5°)/16=0.719° per unit. Since the fine phase shift control setting must produce a 42° phase shift, the magnitude of the setting should be (42°−18.5°)/0.719°/unit=33 in decimal or 100001 in binary. Thus, the overall phase delay of the DQS delay chain is substantially close to 72° and the phase-delayed DQS signal can be center-aligned to the DQ signal. Furthermore, if the sampling edge of the DQS signal subsequently drifts away from the center of the DQ signal's data sampling window, the soft core calibration logic can adjust the dynamic control setting and re-align the two signals.

Note that a memory interface circuit in accordance with the present invention makes it easier for a designer of a PCB and/or an electronic package since there is a larger timing margin for designing the layout of the routing paths connecting the memory device to other ASIC devices. A larger timing margin also leaves more room for the performance improvement of an electronic system including the memory interface circuit. Finally, it will be understood by one skilled in the art that the present invention is applicable to a wide range of state-of-the-art memory device multiple-data-rate standards, e.g., DDR SDRAM, RLDRAM I and DDR FCRAM.

The foregoing description, for purpose of explanation, has been made with reference to specific embodiments. However, the illustrative embodiments described above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated.

What is claimed is:

1. A circuit for generating a signal having a desired phase delay comprising:
    a first delay chain including M delay cells to generate a first phase shift control setting, said first delay chain comprising:
    M identical delay cells connected in series, each delay cell having a first input for receiving a clock signal and a second input for receiving a digital value that is the phase shift control setting and an output for outputting a delayed clock signal;
    a phase detector that measures a phase difference between a signal received at a first input terminal and a signal received at a second input terminal wherein the signal received at the first input terminal is a clock signal that has not been delayed by the first delay chain and the signal received at the second input terminal is a clock signal that has been delayed by at least one of the delay cells of the first delay chain; and
    a digital counter that updates the phase shift control setting in accordance with the phase difference measured by the phase detector and applies the updated phase shift control setting to at least one of the second inputs of the delay cells;
    a circuit for forming a second phase shift control setting; and
    a second delay chain including N delay cells that is configured to receive the first phase shift control setting and the second phase shift control setting to produce the desired phase delay in the signal.

2. The circuit of claim 1, wherein the second circuit includes a first programmable switch for choosing one of a static residual phase shift control setting and a dynamic residual phase shift control setting and a second programmable switch for choosing one of two instruction bits, each instruction bit being associated with one of the two residual phase shift control settings.

3. The circuit of claim 2, wherein the static residual phase shift control setting and its associated instruction bit are pre-computed based upon at least the desired phase delay and the first phase shift control setting and stored in a series of configuration flip-flops, and the dynamic residual phase shift control setting and its associated instruction bit are dynamically determined by a soft core calibration logic based upon at least the desired phase delay and the first phase shift control setting.

4. The circuit of claim 2, wherein the second circuit includes an adder configured to add to or subtract from the first phase shift control setting one of the static and dynamic residual phase shift control settings in accordance with its associated instruction bit to generate the second phase shift control setting.

5. The circuit of claim 1 wherein the second delay chain includes a first programmable switch for choosing one of the first and second phase shift control settings for each delay cell in the second delay chain and a second programmable switch that determines the number of delay cells in the second delay chain.

6. The circuit of claim 1, wherein the first delay chain includes a programmable switch that selects the number of delay cells used in the first delay chain to delay a clock signal applied to the first delay chain.

7. The circuit of claim 1 wherein in the first delay chain the phase shift control setting is changed until the phase difference between the clock signal that has not been delayed by the first delay chain and the clock signal that has been delayed by at least one of the delay cells is substantially close to 360 degrees.

8. The circuit of claim 1 wherein the delay cells of the first delay chain and the delay cells of the second delay chain are identical.

9. The circuit of claim 8 wherein the delayed clock signal at the output of a delay cell is the clock signal received at the first input of the delay cell delayed by an amount specified by the phase shift control setting received at the second input of the delay cell and by an intrinsic delay of the delay cell.

10. The circuit of claim 1 wherein the phase shift control setting is a binary value.

11. A method for generating a signal having a desired phase delay, comprising:
    generating a first phase shift control setting comprising:
    applying a clock signal to a first input of a phase detector and to an input of a first delay chain formed by a plurality of series connected delay cells, each having a first input for receiving a clock signal, a second input for receiving a phase shift control setting and an output for outputting a delayed clock signal;
    applying the first phase shift control setting to the second input of at least one delay cell;
    applying a delayed clock signal from the first delay chain to a second input of the phase detector;
    measuring the phase difference between the signal received at the first input of the phase detector and the signal received at the second input of the phase detector; and providing the measured phase difference to a digital counter that specifies the first phase shift control setting, the first phase shift control setting being changed until the phase difference between the clock signals is substantially close to 360 degrees.

generating a second phase shift control setting; and configuring a set of delay cells in a second delay chain in accordance with the first and second phase shift control settings by selecting how many delay cells to use in the second delay chain to produce the desired phase delay and applying the first phase shift control setting to some cells and the second phase shift control setting to other cells such that a signal passing through the set of delay cells in the second delay chain has the desired phase delay.

12. The method of claim 11, wherein generating a second phase shift control setting comprises:

choosing one of a static residual phase shift control setting and a dynamic residual phase shift control setting;

choosing one of two instruction bits, the chosen instruction bit being associated with the chosen residual phase shift control setting; and adding to or subtracting from the first phase shift control setting the chosen residual phase shift control setting in accordance with the chosen instruction bit to generate the second phase shift control setting.

13. The method of claim 12, wherein the static residual phase shift control setting and its associated instruction bit are pre-computed based upon the desired phase delay and the first phase shift control setting and stored in a series of configuration flip-flops, and the dynamic residual phase shift control setting and its associated instruction bit are dynamically determined based upon the desired phase delay and the first phase shift control setting in accordance with a calibration algorithm.

14. A circuit for generating a phase shift control setting comprising:

a first delay chain including M identical delay cells connected in series, each delay cell having a first input for receiving a clock signal and a second input for receiving a digital value that is a phase shift control setting and an output for outputting a delayed clock signal;

a phase detector that measures a phase difference between a signal received at a first input terminal and a signal received at a second input terminal wherein the signal received at the first input terminal is a clock signal that has not been delayed by the first delay chain and the signal received at the second input terminal is a clock signal that has been delayed by at least one of the delay cells of the first delay chain; and a digital counter that updates the phase shift control setting in accordance with the phase difference measured by the phase detector and applies the updated phase shift control setting to at least one of the second inputs of the delay cells wherein the phase shift control setting is changed until the phase difference between the clock signal received at the first terminal of the phase detector and the clock signal received at the second terminal of the phase detector is substantially close to 360 degrees.

15. A circuit for generating a phase shift control setting comprising:

a first delay chain including M identical delay cells connected in series, each delay cell having a first input for receiving a clock signal and a second input for receiving a digital value that is a phase shift control setting and an output for outputting a delayed clock signal, the delayed clock signal at the output of a delay cell is the clock signal received at the first input of the delay cell delayed by an amount specified by the phase shift control setting received at the second input of the delay cell and by an intrinsic delay of the delay cell;

a phase detector that measures a phase difference between a signal received at a first input terminal and a signal received at a second input terminal wherein the signal received at the first input terminal is a clock signal that has not been delayed by the first delay chain and the signal received at the second input terminal is a clock signal that has been delayed by at least one of the delay cells of the first delay chain; and a digital counter that updates the phase shift control setting in accordance with the phase difference measured by the phase detector and applies the updated phase shift control setting to at least one of the second inputs of the delay cells, wherein the phase shift control setting is changed until the phase difference between the clock signal received at the first terminal of the phase detector and the clock signal received at the second terminal of the phase detector is substantially close to 360 degrees.

* * * * *